US008812917B2

(12) United States Patent
Paumier

(10) Patent No.: US 8,812,917 B2
(45) Date of Patent: Aug. 19, 2014

(54) METHOD AND DEVICE FOR ROW AND COLUMN INTERLEAVING OF BLOCKS OF VARIABLE SIZE

(75) Inventor: Laurent Paumier, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 451 days.

(21) Appl. No.: 12/985,111

(22) Filed: Jan. 5, 2011

(65) Prior Publication Data

US 2011/0167316 A1 Jul. 7, 2011

(30) Foreign Application Priority Data

Jan. 6, 2010 (FR) ...................... 10 00043

(51) Int. Cl.
*G11C 29/00* (2006.01)
*G06F 11/00* (2006.01)

(52) U.S. Cl.
USPC .......................................... 714/701; 714/702

(58) Field of Classification Search
USPC ................................... 714/701, 702
See application file for complete search history.

(56) References Cited

U.S. PATENT DOCUMENTS

| 4,564,945 | A | * | 1/1986 | Glover et al. | 714/769 |
|---|---|---|---|---|---|
| 5,392,299 | A | * | 2/1995 | Rhines et al. | 714/756 |
| 5,983,388 | A | * | 11/1999 | Friedman et al. | 714/776 |
| 6,357,029 | B1 | * | 3/2002 | Sinha et al. | 714/752 |
| 6,631,491 | B1 | * | 10/2003 | Shibutani et al. | 714/762 |
| 6,701,467 | B1 | * | 3/2004 | Victor | 714/701 |
| 7,356,752 | B2 | * | 4/2008 | Hewitt et al. | 714/755 |
| 2003/0014700 | A1 | * | 1/2003 | Giulietti et al. | 714/701 |
| 2004/0054954 | A1 | * | 3/2004 | Adde et al. | 714/755 |
| 2005/0050284 | A1 | | 3/2005 | Lee | |

(Continued)

FOREIGN PATENT DOCUMENTS

| FR | 2857178 A1 | 1/2005 |
|---|---|---|
| GB | 2456292 A | 7/2009 |
| WO | 0203598 A2 | 1/2002 |
| WO | 2006085251 A2 | 8/2006 |

OTHER PUBLICATIONS

Yokokawa, T. et al., "Parity and Column Twist Bit Interleaver for DVB-T2 LDPC Codes," 5th International Symposium on Turbo Codes and Related Topics, pp. 123-127, 2008.
"Frame structure channel coding and modulation for a second generation digital terrestrial television broadcasting system (DVB-T2)," Jun. 1, 2008, pp. 32-35.
Digital Video Broadcasting (DVB); Frame structure channel coding and modulation for a second generation digital terrestrial television broadcasting system (DVB-T2), ETSI EN 302 755 V1.1.1, Sep. 2009, pp. 48-55.

*Primary Examiner* — Joseph D Torres
(74) *Attorney, Agent, or Firm* — Seed IP Law Group PLLC

(57) ABSTRACT

The present disclosure relates to a method for interleaving a stream of input data blocks, the method comprising steps of: subdividing a block into sub-blocks of fixed size in number of data rows and data columns, the sub-blocks being distributed in the block in rows of sub-blocks and in columns of sub-blocks, transferring the data contained in the block into a first memory, while respecting the order of the data in the input stream, transferring the data contained in the block by row of sub-blocks, into a second memory in which the data of each sub-block is accessible from the address of the sub-block, transferring the data of each sub-block by column of sub-blocks, from the second memory into a third memory, by putting back the data of each sub-block in data rows and columns, and transferring the data by data column from the third memory into an output stream.

17 Claims, 3 Drawing Sheets

(56) References Cited

U.S. PATENT DOCUMENTS

| | | | |
|---|---|---|---|
| 2006/0045000 A1* | 3/2006 | Morlier et al. | 370/203 |
| 2007/0220406 A1 | 9/2007 | Gubbi et al. | |
| 2008/0215831 A1* | 9/2008 | Argon et al. | 711/157 |
| 2008/0270714 A1* | 10/2008 | Van Den Bosch | 711/157 |
| 2009/0113271 A1* | 4/2009 | Bae et al. | 714/752 |

* cited by examiner

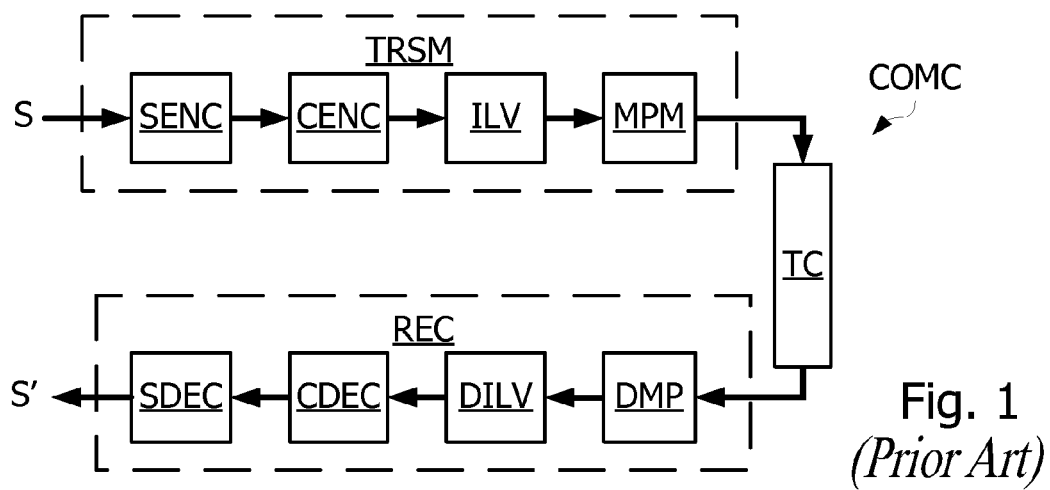
Fig. 1 *(Prior Art)*
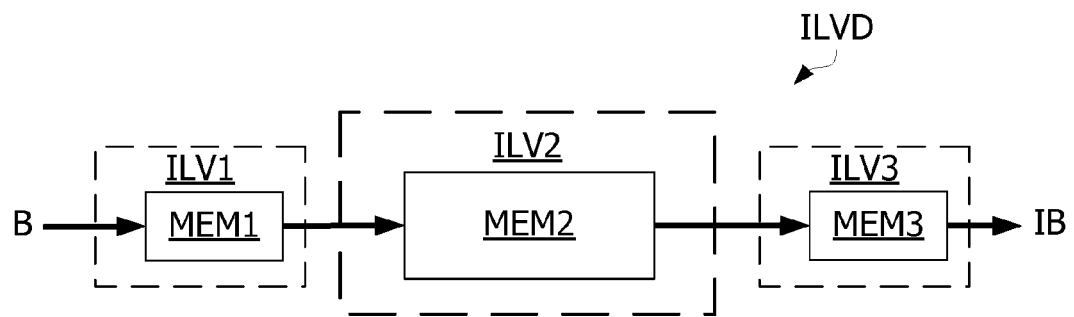
Fig. 2
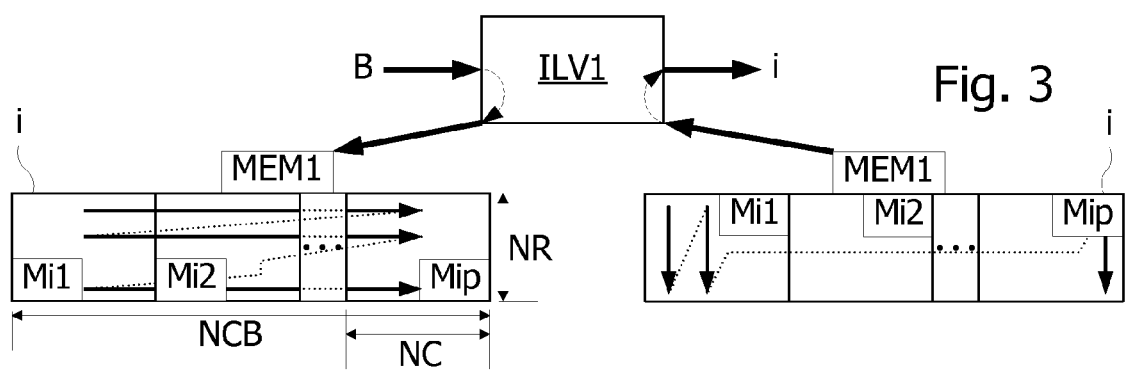
Fig. 3

METHOD AND DEVICE FOR ROW AND COLUMN INTERLEAVING OF BLOCKS OF VARIABLE SIZE

BACKGROUND

1. Technical Field

The present disclosure relates to interleaving and deinterleaving a data stream, particularly a data stream of the standard DVB-T2 (Digital Video Broadcasting-Terrestrial 2).

2. Related Art

Digital broadcasting systems such as the DVB-T2 system can obtain good performances, even in the presence of grouped transmission errors, thanks to a receiver performing, in combination with the error correction and deinterleaving operations, the deinterleaving operation corresponding to an operation that is the opposite of the interleaving performed in the emitter. The deinterleaving operation in the receiver enables any grouped transmission errors to be distributed in a regular manner in a data stream, and thus to be corrected by an error correcting device.

FIG. 1 schematically represents an example of a data block transmission chain. In FIG. 1, the transmission chain COMC comprises a transmitter TRSM receiving a data block to be transmitted S, a transmission link TC and a receiver REC supplying a received data block S'. The transmitter TRSM classically comprises a data compression module SENC receiving the data blocks to be transmitted S, a channel encoding module CENC receiving the compressed data blocks, a data interleaving module ILV receiving the data blocks at the output of the module CENC and a modulator MPM receiving the interleaved data blocks and transmitting them into the transmission link.

The receiver comprises a demodulator DMP receiving the data transmitted by the link TC, and supplying demodulated data blocks, a deinterleaving module DILV receiving the demodulated data blocks, a channel decoding module CDEC receiving the data blocks at the output of the deinterleaving module and a data decompressing module SDEC receiving the data decoded by the module CDEC and supplying the demodulated data blocks S'. The module CDEC may comprise an error correcting module enabling redundancies in the data coding to be used to correct any transmission errors.

There are several methods of interleaving, including methods of block interleaving, in which the data to be interleaved is organized in blocks of several rows and several columns. A block interleaving method involves for example writing the data consecutively, i.e. by row of the block, in a memory, and reading the data in the memory by column of the block, or conversely. If the interleaving method reads a data block in rows and writes it in columns, the corresponding deinterleaving method reads a data block in columns and writes it in rows, to obtain a block of non-interleaved data. Conversely, if the interleaving method reads a data block in columns and writes it in rows, the corresponding deinterleaving method reads a data block in rows and writes it in columns. From a functional point of view, the interleaving and deinterleaving operations are therefore equivalent. Below, the word "interleaving" means both an interleaving operation and a deinterleaving operation.

The latency of a block interleaving operation is one data block, i.e. the first datum of a data block is supplied at the output of the interleaving module when the entire block is received by the module. In some systems like those complying with the standard DVB-T2, the size of the blocks is variable. The blocks can be interleaved using two memory zones enabling two blocks to be stored simultaneously, one of the two blocks being written while the other block is read. Therefore the prior art methods require the use of a memory with a capacity which is greater than two times the maximum size of a block. This solution proves very expensive in terms of necessary memory size when the maximum size of a block is high. According to standard DVB-T2, a data block comprises 557,056 data of 32 bits. The size of the memory used by the interleaving operation must therefore be at least two times 17.8 Mbits.

BRIEF SUMMARY

One embodiment is a block interleaving device, supporting a variable block size and using a reduced memory capacity.

One embodiment relates to a method for interleaving an input data stream distributed in data blocks each having a number of data rows and a number of data columns transversal to the data rows. According to one embodiment, the method comprises the steps of: subdividing a data block into sub-blocks each having a fixed number of data rows and a fixed number of data columns, the sub-blocks being distributed in the block in rows of sub-blocks and columns of sub-blocks transversal to the rows of sub-blocks, if the number of rows in a sub-block is greater than 1, transferring the data contained in the block into a first memory, in the same order as the order in which the data appears in the input data stream, transferring the data contained in the block, by row of sub-blocks, into a second memory in which the data of each sub-block of the block is accessible from an address of the sub-block, if the number of columns in a sub-block is greater than 1, transferring the data contained in each sub-block, by column of sub-blocks, from the second memory to a third memory, by putting back the data of each sub-block in data rows and columns in the sub-block, and transferring the data contained in the data block by data column into an output stream, from the second memory if the number of data columns in a sub-block is equal to 1, or from the third memory if the number of data columns in a sub-block is greater than 1.

According to one embodiment, the method comprises a step of selecting the number of rows and/or the number of columns of a sub-block, so that the number of rows and/or the number of columns of a data block is respectively a multiple of the number of rows and of the number of columns of a sub-block.

According to one embodiment, the data of each sub-block in the second memory is accessed from a sub-block index number stored in a fourth memory.

According to one embodiment, the number of rows and the number of columns of a sub-block are chosen so as to limit the total size of the first, third and fourth memories.

According to one embodiment, the method comprises a step of transferring data of a row of sub-blocks of a next block in the second memory to addresses occupied by data of a column of sub-blocks of the block, transferred into the third memory or into the output stream.

One embodiment also relates to a device for interleaving an input data stream distributed in data blocks each having a number of data rows and a number of data columns transversal to the data rows. According to one embodiment, the device is configured to implement the method defined previously.

According to one embodiment, the data blocks received are divided into sub-blocks each having a fixed number of data rows and a fixed number of data columns, the sub-blocks being distributed in the block in rows of sub-blocks and in columns of sub-blocks transversal to the rows of sub-blocks, the device comprising a first memory provided for receiving a row of sub-blocks of a data block.

According to one embodiment, the first memory has a capacity limited to the maximum size of a row of sub-blocks of a data block.

According to one embodiment, the device is a second memory provided for receiving a data block.

According to one embodiment, the second memory has a capacity limited to the maximum size of a data block.

According to one embodiment, the device comprises a fourth memory storing index numbers, each index number enabling the data of a sub-block to be accessed in the second memory.

According to one embodiment, the data blocks received are divided into sub-blocks each having a fixed number of data rows and a fixed number of data columns, the sub-blocks being distributed in the block in rows of sub-blocks and in columns of sub-blocks transversal to the rows of sub-blocks, the device comprising a third memory provided for receiving a column of sub-blocks of a data block.

According to one embodiment, the third memory has a capacity limited to the maximum size of a column of sub-blocks of a data block.

One embodiment also relates to a signal receiving terminal comprising an interleaving device as defined previously.

According to one embodiment, the signals are compliant with the standard DVB-T2.

BRIEF DESCRIPTION OF THE SEVERAL VIEWS OF THE DRAWINGS

Some examples of embodiments of the present disclosure will be described below in relation with, but not limited to, the following Figures, in which:

FIG. 1, described previously, schematically represents a digital data transmission chain.

FIG. 2 schematically represents an interleaving device, according to one embodiment.

FIG. 3 schematically represents a first module of an interleaving device, according to one embodiment.

DETAILED DESCRIPTION

Figure 4:
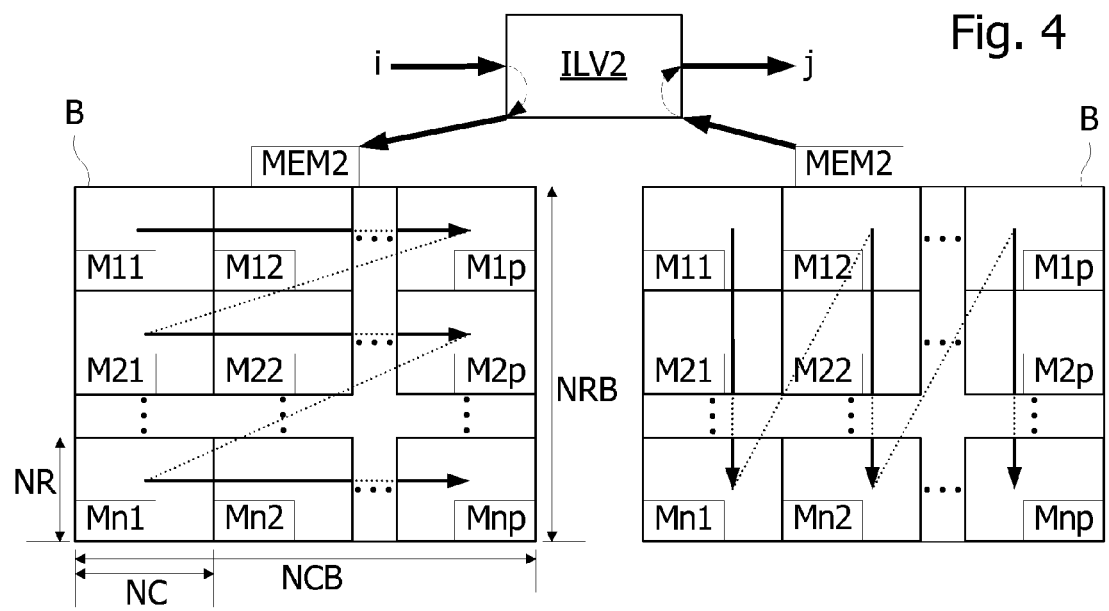
FIG. 4 schematically represents a second module of an interleaving device, according to one embodiment.

FIG. 2 represents an interleaving device, according to one embodiment. In FIG. 2, the interleaving device ILVD comprises three interleaving modules ILV1, ILV2, ILV3. The first module ILV1 comprises a memory MEM1 receiving the data to be interleaved in the form of data blocks B. The second module ILV2 comprises a memory MEM2 receiving data at the output of the module ILV1. The third module ILV3 comprises a memory MEM3 receiving data at the output of the module ILV2, and supplies interleaved data blocks IB. The blocks B can have variable numbers of rows and columns like in the standard DVB-T2. The data is distributed in the data blocks in data rows and data columns transversal to the data rows, and the number of data rows and columns can vary from one block to the next.

It is possible to use a single memory zone the capacity of which is equal to the maximum size of a block and to write the data of a block as and when the data of another block are read, at the locations already read. Therefore, it is possible to use a single-port memory having the same size as a data block, provided it is not being used to read and write during a same cycle, if the clock frequency pacing the memory is set to a value enabling at least one data read operation and one data write operation in the memory, while a datum is being received.

This solution is well suited to data blocks that are consistent in size. If the data blocks have a variable size, it is beneficial, in order to avoid conflicts in memory access, to be able to read the data of a block faster than the writing of a next block, so long as the block being written immediately follows the block being read. Furthermore, when the data blocks transmitted have variable sizes, the use of a single memory zone does not enable all the combinations of block size changes to be supported, in particular when a data block is transmitted after a smaller data block.

One embodiment is a block interleaving device, supporting a variable block size and using a reduced memory capacity.

According to one embodiment, the data blocks B at input of the device ILVD are divided into sub-blocks having fixed numbers of data rows and columns, the sub-blocks being divided into rows of sub-blocks and into columns of sub-blocks transversal to the rows of sub-blocks. FIG. 3 represents the module ILV1 and a row i of sub-blocks Mi1, Mi2, ... Mip of a data block, in the memory MEM1, when the latter is written (on the left in the figure) and when the latter is read in the memory (on the right in the figure). Each sub-block Mi1-Mip has fixed numbers of rows NR and columns NC. Each data row contained in the row i of sub-blocks comprises a number NCB of data which can be variable, corresponding to the number of data columns of the data block.

According to one embodiment, the memory MEM1 of the module ILV1 has a capacity corresponding to the maximum size of a row i of sub-blocks Mi1-Mip, i.e. NR times the maximum number of columns of a data block B. The module ILV1 successively receives the data of a data block B and inserts it into the memory MEM1 at consecutive addresses, starting at a first address of the memory MEM1, as indicated by the horizontal arrows in the row of sub-blocks i on the left in FIG. 3. A first datum of each row of sub-blocks i is stored at the first address of the memory MEM1. When the memory MEM1 has received all the data of a row of sub-blocks i, the module ILV1 reads the memory MEM1 and transmits the data read to the module ILV2, so that all the data of each of the sub-blocks Mi1-Mip is transmitted consecutively. For this purpose, the module ILV1 can read the memory MEM1 by column as indicated by the vertical arrows in the row of sub-blocks on the right in FIG. 3. All the rows of sub-blocks i of a data block B thus transit via the memory MEM1 and are transmitted to the module ILV2.

It shall be noted that if the memory MEM1 is simultaneously write- and read-accessible (case of a double-port memory) or if it can be both write- and read-accessed during a same cycle of receiving a datum, the reading of the memory MEM1 can start when the memory MEM1 contains at least the data of the first NR−1 rows of the row of sub-blocks i and a first datum of the last row NR of the row of sub-blocks.

FIG. 4 represents the module ILV2 and a block B in the memory MEM2, when the latter is written in the memory (on the left in the figure) and when the latter is read in the memory (on the right in the figure). The data of the rows of sub-blocks i of a block B is stored in the memory MEM2, with a distribution corresponding to the order in which it is received by the module ILV2. The block B stored in the memory MEM2 thus comprises sub-blocks M11, M12, ... M1p, M21, M22, ... M2p, .... Mn1, Mn2, ... Mnp, each sub-block having a size, which can be fixed, of NR rows and NC columns. The data block B has the number of columns NCB and a number of rows NRB which can be variable. The number of sub-blocks per row or per column of sub-blocks can therefore be variable. The memory MEM2 of the module ILV2 has a capacity corresponding to at least the maximum size of a block B. When the block B corresponds to a first block of a sequence of data blocks, the latter is written in the memory MEM2 by successively filling the sub-blocks M11-Mnp in ascending order of the addresses thereof (along the arrows in block B on the left in FIG. 4). When all the data of the block B is in the memory MEM2, the data of the block B is read by column of sub-blocks M11-Mnp in the memory MEM2 (along the arrows in block B on the right in FIG. 4), respecting, for example, the order in which the data has been stored in each sub-block. The data read is transmitted to the module ILV3.

It shall be noted that if the memory MEM2 is simultaneously write- and read-accessible or if it can be both write- and read-accessed during a same cycle of receiving a datum, the reading of the memory MEM2 can start when the latter contains at least the data of a first column of sub-blocks M11 to Mn1.

Figure 5:
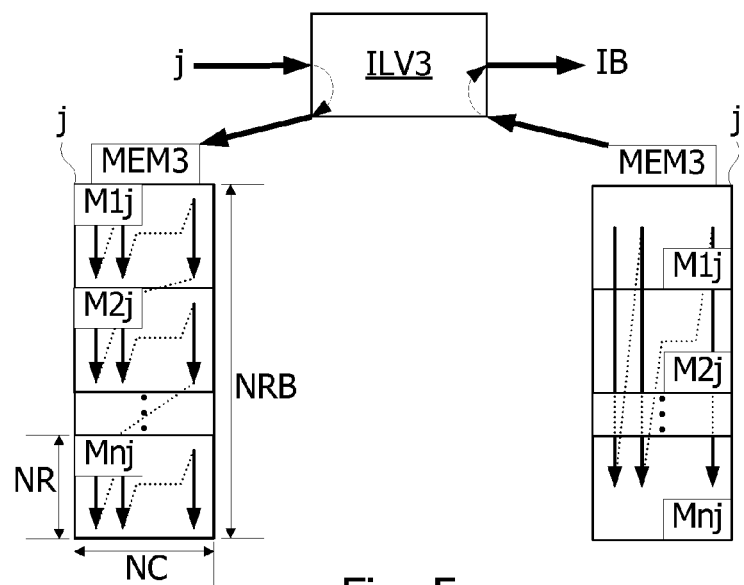
FIG. 5 schematically represents a third module of an interleaving device, according to one embodiment.

FIG. 5 represents the module ILV3 and a column j of sub-blocks M1j-Mnj in the memory MEM3, when the latter is written (on the left in the Figure) and when the latter is read in the memory (on the right in the Figure). The column j of sub-blocks M1j-Mnj has a number of data columns equal to the number NC of columns in a sub-block M11-Mnp, and a number of rows equal to the number of rows NRB of the block B. According to one embodiment, the memory MEM3 of the module ILV3 has a capacity corresponding to the maximum size of a column of sub-blocks M1j-Mnj, i.e. the number of columns NC times the maximum number of rows of a data block B. The module ILV3 successively receives the data of each of the sub-blocks M11-Mnp of a column of sub-blocks j in the data block B and inserts it into the memory MEM3, starting at a first address of the memory MEM3, as indicated in FIG. 5 by the vertical arrows in the column of sub-blocks j on the left. The data is transferred into the memory MEM3 by restoring the row and column position of the data in each sub-block, as it was in the original block in the memory MEM1.

Therefore, a datum of rank k in the memory MEM1, k being between 0 and NCB×NR−1, is transferred to the memory MEM2 to a rank k' obtained using the following formula:

$$k'=\text{floor}(k/NCB)+\text{mod}(k,NCB)\times NR \quad (1)$$

wherein mod(a,b) is a function supplying the remainder of the integer division of a by b, and floor(a) is a function equal to the integer part of a. Thus, mod(k,NCB), and floor(k/NCB) represent the column and row numbers of the datum of rank k.

Other formulas can be considered provided that the data of each of the sub-blocks is supplied consecutively by the memory MEM1. Thus, the rank k' of a datum at the output of the memory MEM1 can be calculated from the rank k of the datum in the block received by the interleaving device ILVD, in the following manner:

$$k'=\text{mod}(\text{mod}(k,NCB),NC)+\text{floor}(\text{mod}(k,NCB)/NC)\times NM+\text{floor}(k/NCB)\times NC \quad (2)$$

wherein NM=NR×NC.

A datum introduced into the memory MEM3 with a rank k, k being between 0 and NRB×NC−1, is transferred into the output stream with a rank k' which can be obtained using the following formula, if the formula (2) is used to read the memory MEM1:

$$k'=\text{floor}(k/NC)+\text{mod}(k,NC)\times NRB \quad (3)$$

If the formula (1) is used to read the memory MEM1, a datum of rank k can be transferred from the memory MEM2 into the memory MEM3 with a rank k' obtained using the following formula:

$$k'=\text{floor}(\text{mod}(k,NR\times NC)/NR)\times NRB+\text{floor}(k/NM)\times NR+\text{mod}(\text{mod}(k,NM),NR) \quad (4)$$

When the memory MEM3 has received all the data of a column of sub-blocks j, the module ILV3 reads the memory MEM3 by data column as indicated by the vertical arrows in the column of sub-blocks j on the right in FIG. 5, each data column comprising NRB data. All the columns of sub-blocks M11-Mnp of a data block B thus transit via the memory MEM3 and are transmitted to the output of the interleaving device ILVD in the form of an interleaved data block IB wherein the data of each row of the block B is distributed in a same order on a data column and the data of each column of the block B is distributed in a same order on a data row.

Figure 6:
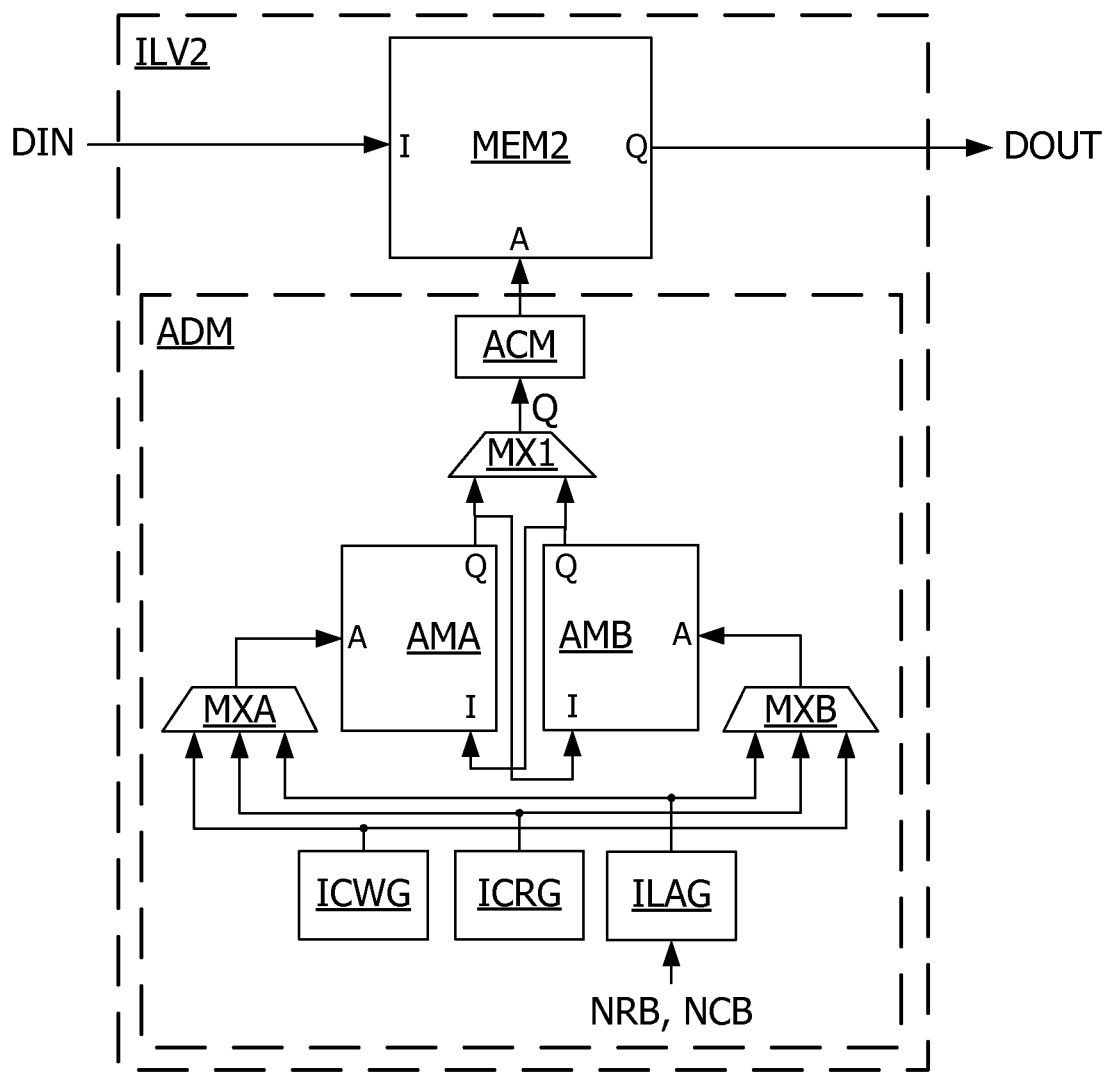
FIG. 6 schematically represents a second module of an interleaving device, according to one embodiment.

According to one embodiment, the memory MEM2 of the module ILV2 has a capacity corresponding exactly to the maximum size of a block B, and comprises addressing memories enabling the memory MEM2 to be reused as and when it is read. For this purpose, the module ILV2 has the architecture represented in FIG. 6. FIG. 6 represents the module ILV2 according to one embodiment. The module ILV2 comprises an addressing module ADM enabling the memory MEM2 to be read- and write-addressed. The memory MEM2 comprises a data input port I receiving data DIN to be stored, and an output port Q supplying data DOUT read in the memory. The module ADM comprises two addressing memories AMA, AMB each comprising an address port A, an input data port I and an output data port Q. The address ports A of the memories AMA, AMB are connected to the output of a respective multiplexer MXA, MXB. Each multiplexer MXA, MXB comprises address inputs respectively connected to the output of an incremental address generator ICWG, of an incremental address generator ICRG, and of an interleaving address generator ILAG. The generator ILAG receives the numbers of rows and columns NRB, NCB of the data block to be processed B.

The data output Q of each address memory AMA, AMB is connected to the input I of the other address memory AMA, AMB and to a respective input of a multiplexer MX1. The output of the multiplexer MX1 supplies an address calculation module ACM, one output of which is connected to the address port A of the memory MEM2, with an index number Q of a sub-block M11-Mnp to be accessed in the memory MEM2. The generators ICWG, ICRG supply consecutive addresses for reading the memories AMA, AMB in which the indexes of the sub-blocks M11-Mnp to be respectively read- and write-accessed are stored. The generator ILAG supplies addresses for writing the index of sub-blocks in the memories AMA, AMB, the addresses supplied being interleaved. The module ACM calculates an address of the memory MEM2 according to a sub-block index number Q and the rank of a datum of a block to be read or written in the memory MEM2. The capacity of each of the address memories AMA, AMB corresponds to the maximum number of sub-blocks of NM=NR×NC data, contained in a data block B, i.e. NBmax/NM, NBmax being the maximum number of data in a data block B. The total memory capacity for the module ILV2 (MEM2, AMA, AMB) can therefore be equal to NBmax (1+2/NM) words. The indexes of the sub-blocks can be coded in the form of words the size of which depends on the number of sub-blocks in a data block. If the data come in the form of words of 32 bits, and if the indexes of the sub-blocks can be coded in the form of words of 16 bits, the total memory capacity of the module ILV2 can be reduced to NBmax (1+1/NM) words of 32 bits.

The memories AMA and AMB are, for example, set by increasing index numbers of sub-blocks M11-Mnp. The memories AMA, AMB may be read every time a new sub-block is accessed, i.e. every NR×NC data. During the processing of a first block, the generator ICWG addresses the memory AMA so as to store the data of the block in the memory MEM2, in successive sub-blocks M11-Mnp. In parallel, the sub-block index numbers supplied by the memory AMA are transmitted to the memory AMB to be stored in it at interleaved addresses supplied by the generator ILAG.

When the module ILV2 receives a second block, the memory AMB is addressed in a sequential manner by the module ICRG to obtain the interleaved index numbers of the sub-blocks M11-Mnp to be read-accessed, in which the data of the first block in the memory MEM2 is stored. In parallel (during periods when the memory AMB is not read-accessed), the module ICWG addresses the memory AMB in a sequential manner to obtain the interleaved index numbers of the sub-blocks M11-Mnp to be write-accessed, to write therein the data of the second block in the memory MEM2. Therefore, the index numbers obtained from the modules ICRG and ICWG are the same so as to write the data of the second block at the locations read in the memory MEM2, the module ICRG being ahead of the module ICWG to ensure that an address of the memory MEM2, in which a datum is located, is always read before being written. The index numbers read in the memory AMB for example by the module ICWG are transferred into the memory AMA to interleaved addresses generated by the generator ILAG. When the module ILV2 receives a third block, the second block is read in the sub-blocks M11-Mnp having index numbers read sequentially in the memory AMA, and the data of the third block is transferred into the sub-blocks read. In parallel, the index numbers read in the memory AMA are transferred into the memory AMB to interleaved addresses generated by the module ILAG. This processing is thus repeated for all the data blocks of a sequence of blocks.

It shall be noted that the provision of the two read ICRG and write ICWG incremental address generation modules enables the reading and writing of a datum in the memory MEM2 to be made independent, and in particular the reading of a datum in the memory MEM2 not to be dependent on the receipt of a datum of the same rank to be written in this memory. It will be understood that a single read incremental address generation module may be provided. In this case, each operation of reading a datum at an address of the memory MEM2 may be followed by an operation of writing a datum at this address, before another address of the memory MEM2 is read.

To explain the functioning of the module ADM, the example of a sequence of two successive data blocks B1 of size NRB1×NCB1=N1 and B2 of size NRB2×NCB2=N2 will be taken. The block B is divided into sub-blocks numbered from M11 to Mn1p1, and the block B2 is divided into sub-blocks numbered from M11 to Mn2p2. The address A of a datum of rank k of a block to be read or to be written is calculated by the address calculation module ACM in the following manner:

$$A = NM \times Q + \mathrm{mod}(k, NM) \quad (5)$$

In this formula, NM (=NR×NC) is the number of data in each sub-block M11-Mnp, Q is the sub-block index number read in the memory AMA or AMB and located at the output of the multiplexer MX1, k is the rank of the datum in the block B (being between 0 and NRB×NCB−1) as the latter is stored in the memory MEM2. The function mod(k,NM) therefore supplies the position of the datum of rank k in a sub-block stored in the memory MEM2.

During a first step of the block B1 being received by the module ILV2, the data of the block B1 is stored sequentially in the memory MEM2 at consecutive addresses determined from consecutive index numbers supplied by the memory AMA, due to the fact that the memory AMA is set with consecutive index numbers and read in a sequential manner. The index numbers read in the memory AMA are transferred into the memory AMB to interleaved addresses generated by the module ILAG.

During a second step of reading the first block B1, the memory AMB is addressed sequentially by the module ICRG to obtain the index numbers of the sub-blocks M11-Mn1p1 to be read. Therefore, upon the reading of a datum of rank k of the block B1, the memory AMB is read if mod(k,NM)=0, at an address equal to floor(k/NM) supplied by the module ICRG. The index number Q read in the memory AMB is supplied to the module ACM which calculates, by applying the formula (5), the address of the memory MEM2 to be used to read a datum of the block B1. If the condition mod(k,NM)=0 is not met, the index number Q previously read in the memory AMB is used by the module ACM to calculate the read address of the memory MEM2 using the formula (5).

A datum of the block B2 is written in the memory MEM2 at the address of a datum of the block B1 which has just been read. This writing is done in the same way as the reading of a datum of the block B1 in the memory MEM2, except that the read address of the memory AMB is supplied by the module ICWG. When a datum is being written in the memory MEM2, the memory AMA receives the index numbers Q read in the memory AMB and stores them at interleaved addresses AA generated by the module ILAG, by applying the following formula:

If floor($k/NM$)≠$N2/NM-1$, $AA = \mathrm{mod}(\mathrm{floor}(k/NM) \times (NRB2/NR), N2/NM-1)$ Or otherwise $AA = N2/NM-1$     (6)

The memory MEM2 is read-accessed until the entire block B1 has been transferred to the output of the module ILV2, and write-accessed until the entire block B2 has been stored in the memory MEM2. If the size N2 of the block B2 is smaller than the size N1 of the block B1, the sub-block indexes which have not been read in the memory AMB are then transferred into the memory AMA to consecutive addresses. Thus, the read address of the memory AMB is equal to the write address of the memory AMA (non-interleaved transfer of the index numbers from the memory AMB to the memory AMA) when the sub-block index of the block B1 is between N2/NM and N1/NM−1. This operation is performed for subsequent blocks having a size greater than N2.

In each of the following steps of receiving a new data block and of reading the previous block, the operations performed during the second step are executed by reversing the roles of the memories AMA and AMB compared to the previous step.

The description above of the steps of receiving data blocks is applicable when the ratio of the number of columns of a block NCB to the number of columns of a sub-block NC and the ratio of the number of rows of a block NRB to the number of rows of a sub-block NR are whole numbers.

When the ratios NCB/NC and NRB/NR of a block of NCB×NRB data are not whole numbers, the module ACM calculates the address RA of a datum of rank k in the data block, to be read in the memory MEM2, according to the sub-block index number Q, in the following manner:

If $0 \leq k < NDC \times NRB$, $RA = NM \times Q + \mathrm{mod}(\mathrm{mod}(k, NC \times NRB), NM)$, Or otherwise if $NDC \times NRB \leq k < NRB \times NCB$, $RA = NM \times Q + \mathrm{mod}\ [k-NDC \times NRB, (NCB-NDC) \times NR]$     (7)

with NDC=floor(NCB/NC)×NC

Similarly, to calculate the write address WA of a datum of rank k of a block in the memory MEM2, the module ACM applies the following formula:

If $0 \leq k < NDR \times NCB$, $WA = NM \times Q + \mathrm{mod}(\mathrm{mod}(k, NR \times NCB), NM)$, Or otherwise if $NDR \times NCB \leq k < NRB \times NCB$, $WA = NM \times Q + \mathrm{mod}\ [k-NDR \times NCB, (NRB-NDR) \times NC]$     (8)

with NDR=floor(NRB/NR)×NR

During a first step of writing the first block B1 of size NRB1 rows and NCB1 columns, in the memory MEM2, the memory AMA is accessed sequentially and supplies consecutive sub-block index numbers, and the module ACM applies the formula (8) to determine the write address of each datum of the block B1.

During a second step of reading the block B1 in the memory MEM2, the memory AMB is read when the following condition is met:

$k<NDC1\times NRB1$ and $\mathrm{mod}(\mathrm{mod}(k,NRB1\times NC),NM)=0$ or $k\geq NDC1\times NRB1$ and $\mathrm{mod}(k-NDC1\times NRB1,(NCB1-NDC1)\times NR)=0$ \hfill (9)

with NDC1=floor(NCB1/NC)×NC

The read address RA of the memory AMB can be determined according to the rank k of the datum of the block B1 to be read in the memory MEM2, in the following manner:

if $k<NDC1\times NRB1$ $RA=\mathrm{ceil}(NRB1/NR)\times\mathrm{floor}(k/(NC\times NRB1))+\mathrm{floor}(\mathrm{mod}(k,NC\times NRB1)/NM)$ or otherwise $RA=\mathrm{floor}(NCB1/NC)*\mathrm{ceil}(NRB1/NR)+\mathrm{floor}[(k-NDC1\times NRB1)/((NCB1-NDC1)\times NR)]$ \hfill (10)

wherein the function ceil(a)=floor(a)+1 if a is not a whole number and ceil(a)=floor(a) if a is a whole number.

The index number Q read in the memory AMB at the address RA is used by the module ACM to calculate the read address of the datum of the block B1 in the memory MEM2.

If it is a datum of the block B2 to be written, the read address RA of the memory AMB can be determined according to the rank k of the datum to be written of the block B2 of size NRB2 rows and NCB2 columns, in the following manner:

If $k<NDR2\times NCB2$ $RA=\mathrm{ceil}(NCB2/NC)\times\mathrm{floor}(k/(NR\times NCB2))+\mathrm{floor}(\mathrm{mod}(k,NR\times NCB2)/NM)$ Or otherwise $RA=\mathrm{floor}(NRB2/NR)\times\mathrm{ceil}(NCB2/NC)+\mathrm{floor}((k-NDR2\times NCB2)/((NRB2-NDR2)\times NC))$ \hfill (11)

with NDC2=floor(NCB2/NC)×NC and NDR2=floor(NRB2/NR)×NR.

The index number Q read in the memory AMB at the address RA is used by the module ACM to calculate the write address of the datum of rank k of the block B2 in the memory MEM2.

The module ILAG calculates the write address WA in the memory AMA of the index number Q read in the memory AMB in the following manner:

If $RA\neq\mathrm{ceil}(NCB2/NC)\times\mathrm{ceil}(NRB2/NR)-1$, $WA=\mathrm{mod}(RA\times\mathrm{ceil}(NRB2/NR),$ $\mathrm{ceil}(NCB2/NC)\times\mathrm{ceil}(NRB2/NR)-1)$ Or otherwise $WA=\mathrm{ceil}(NCB2/NC)\times\mathrm{ceil}(NRB2/NR)-1$ \hfill (12)

Furthermore, it may be beneficial to transfer the index numbers not read in the memory AMB, to the memory AMA during wait cycles. This transfer is done if the following condition is met:

$\mathrm{ceil}(NCB2/NC)\times\mathrm{ceil}(NRB2/NR)<\mathrm{ceil}(NCB1/NC)\times\mathrm{ceil}(NRB1/NR)$ \hfill (13)

This transfer is done by reading the memory AMB in an incremental manner and by transferring the value read to the same address in the memory AMA for all the address values being between ceil(NCB2/NC)×ceil(NRB2/NR) and ceil(NCB1/NC)×ceil(NRB1/NR)−1.

In each of the following steps of receiving a new data block and of reading the previous block, the operations performed during the second step are executed by reversing the roles of the memories AMA and AMB compared to the previous step.

Appendix 1 indicates as an example the order of arrival of data of a block in the memories MEM1, MEM2 and MEM3 at some of steps 1 to 11 of interleaving the block. In the example of Appendix 1, the block B comprises data D(1,1)-D(10,12) distributed in 12 columns and 10 rows. The data is indicated in Appendix 1 in an order corresponding to an operation of reading by row from left to right, and then by column from top to bottom. Appendix 1 illustrates the case in which the number of columns of a sub-block NC is chosen equal to 3 and the number of rows of a sub-block NR equal to 2. The memory MEM1 is therefore dimensioned for receiving two rows of 12 data of a block B, and the memory MEM3 three columns of 10 data of the block B.

In step 1, the data of the first NR=2 rows D(1,1)-D(1,12) and D(2,1)-D(2,12) of a block is received by the interleaving device and transferred into the memory MEM1 of the module ILV1. In step 2, the data in the memory MEM1 is transferred into the memory MEM2 of the module ILV2, and the data of the next two rows of the block D(3,1)-D(3,12) and D(4,1)-D(4,12) of the block is received by the interleaving device and transferred into the memory MEM1. The transfer of the data into the memory MEM2 is performed so that the data of each sub-block is at consecutive addresses in the memory MEM2. In step 3, the data in the memory MEM1 is transferred into the memory MEM2, and the data of the next two rows D(5,1)-D(5,12) and D(6,1)-D(6,12) of the block is received by the interleaving device and transferred into the memory MEM1. In step 5, the data in the memory MEM1 is transferred into the memory MEM2 and the data of the last two rows D(9,1)-D(9,12) and D(10,1)-D(10,12) of the block is received by the interleaving device and transferred into the memory MEM1. In step 6, the data in the memory MEM1 is transferred into the memory MEM2. The memory MEM2 then contains all the data contained in the block D(1,1)-D(10,12). In step 7, the data D(1,1)-D(10,1), D(1,2)-D(10,2), D(1,3)-D(10,3) of the first NC=3 columns of the memory MEM2 is transferred into the memory MEM3 of the module ILV3. In step 8, the data in the memory MEM3 is read on a data column-by-data column basis and transferred into an output stream, and the data of the next three columns D(1,4)-D(10,6) of the block in the memory MEM2 is transferred into the memory MEM3 to replace the data transferred into the output stream. In step 10, the data in the memory MEM3 is read on a data column-by-data column basis and transferred into the output stream, and the data of the last three columns D(1,10)-D(10,10), D(1,11)-D(10,11), D(1,12)-D(10,12) of the block located in the memory MEM2 is transferred into the memory MEM3 to replace the data transferred into the output stream. In step 11, the last step of processing the block, the data in the memory MEM3 is transferred into the output stream. The output stream thus contains all the data rows of the block at input of the interleaving device, wherein the data in the data columns of the block at input of the device ILVD appears consecutively in the output stream.

In step 6 and following, the memory MEM1 can receive the data rows of a next block in pairs. From step 7 onwards, the data of the next block in the memory MEM1 can be transferred into the memory MEM2 to the locations left vacant by the data transferred into the memory MEM3. The result is that the data of the block is written by column in the memory MEM2. The addresses at which the data of the next block is stored are stored in one of the memories AMA, AMB.

The memory MEM3 could also be filled by row as shown in the example of Appendix 2 indicating the state of the memories MEM1, MEM2, MEM3 from the step 7 onwards in which the memory MEM3 starts to be used. In this example, in steps 7 to 10, a column of sub-blocks coming from the memory MEM2 is transferred into the memory MEM3 in row of sub-blocks, the data of each sub-block being transferred into the memory MEM3 by reversing the data rows and columns of the sub-block. In steps 8 to 11, unlike the example of Appendix 1, the memory MEM3 is read on a data row-by-data row basis, the data read being transferred into the output stream.

In the example of Appendix 2, a datum of rank k, k being between 0 and NRB×NC−1, read in a column of sub-blocks of the memory MEM2, is transferred into the memory MEM3 to an address k' obtained using the formula (4). The data in the memory MEM3 can then be transferred into the output stream by consecutively reading the addresses at which it is stored.

Generally speaking, there are many possibilities of arranging the data in the memories MEM1, MEM3, taking the principles of the disclosure into account. The addresses for reading the data in a memory benefit from being consistent with the addresses for writing such data in this memory.

In accordance with the standard DVB-T2, the size of a data block can have the values summarized in table 1 below:

TABLE 1

| Mode | NRB | NCB (multiple of 5) | NBmax |
|---|---|---|---|
| Long frame 256-QAM | 1,620 | from 5 to 340 | 550,800 |
| Long frame 64-QAM | 2,160 | from 5 to 255 | 550,800 |
| Long frame 16-QAM | 3,240 | from 5 to 170 | 550,800 |
| Long frame QPSK | 6,480 | from 5 to 85 | 550,800 |
| Short frame 256-QAM | 405 | from 5 to 1,375 | 556,875 |
| Short frame 64-QAM | 540 | from 5 to 1,030 | 556,200 |
| Short frame 16-QAM | 810 | from 5 to 685 | 554,850 |
| Short frame QPSK | 1,620 | from 5 to 340 | 550,800 |

Given the possible block sizes summarized in table 1, if a sub-block size is chosen such that the ratios NRB/NR and NCB/NC are whole numbers, the number NC can be chosen equal to 1 or 5, and the number NR can be chosen equal to one of the values 1, 3, 5, 9, 15, 45 and 135. If the number NR or NC is chosen equal to 1, the interleaving device ILVD does not then comprise any module ILV1 or ILV3, respectively. The case in which the numbers NR and NC are both equal to 1 is not considered as it corresponds to an interleaving device conforming to prior art, i.e. comprising only the interleaving module ILV2, and without subdividing the block into sub-blocks of fixed size.

Given the values indicated in table 1, the following table 2 summarizes the capacities of the memories MEM1, MEM3, AMA, AMB, on the understanding that the memory MEM1 has a capacity of 17 Mbits to be capable of storing a block of 556,875 data of 32 bits.

TABLE 2

| | | Capacity of (in Mbits): | | | |
|---|---|---|---|---|---|
| NC | NR | MEM1 | MEM3 | AMA + AMB | Total |
| 1 | 3 | 0.26 | 0 | 6.68 | 6.94 |
| | 5 | 0.44 | 0 | 3.79 | 4.23 |
| | 9 | 0.79 | 0 | 1.98 | 2.77 |
| | 15 | 1.32 | 0 | 1.19 | 2.51 |
| | 45 | 3.96 | 0 | 0.35 | 4.31 |
| | 135 | 11.88 | 0 | 0.11 | 11.99 |
| 5 | 1 | 0 | 2.07 | 3.79 | 3.79 |
| | 3 | 0.26 | 2.07 | 1.19 | 3.52 |
| | 5 | 0.44 | 2.07 | 0.67 | 3.18 |
| | 9 | 0.79 | 2.07 | 0.34 | 3.2 |
| | 15 | 1.32 | 2.07 | 0.19 | 3.58 |
| | 45 | 3.96 | 2.07 | 0.06 | 6.09 |
| | 135 | 11.88 | 2.07 | 0.02 | 13.97 |

In the table, a minimum total capacity value of 2.51 Mbits is reached when NC=1 and NR=15, and a minimum total capacity value of 3.18 Mbits is reached when the numbers NC and NR are equal to 5. The capacity of the device ILVD can therefore be lower than the capacity of the memory required for an interleaving device of prior art that is capable of processing data blocks of variable size, i.e. equal to two times the maximum size of a block complying with the standard DVB-T2.

In some cases, the modules ILV1 and ILV3 may use memories that are dedicated to processing operations before or after the interleaving process. In the standard DVB-T2, the interleaving performed by the module ILV3 can be done on-the-fly in a cell deinterleaving module provided at the output of the device ILVD. The result is that some of the memory capacity of module ILV3 indicated in table 2 can be removed, such that the module can operate with only an additional 1.11 Mbits added to the capacity of the memory MEM2 for the module ILVD, if the numbers NR and NC are both chosen equal to 5.

It will be understood by those skilled in the art that various alternative embodiments and various applications of the present disclosure are possible. In particular, the present disclosure is not limited to data streams complying with the standard DVB-T2 but can be applied to any data stream comprising data blocks containing data disposed in rows and in columns.

Furthermore, the present disclosure is not limited to the interleaving module ILV2 represented in FIG. 6. Other embodiments of the module ILV2 can be considered while remaining within the framework of the present disclosure. Thus, for example, the memories AMA and AMB can be removed and replaced with circuits calculating index numbers of sub-blocks to be write- or read-accessed.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

APPENDIX 1

1 Step 1
2
3 MEM1

| D(1,1) | D(1,2) | D(1,3) | D(1,4) | D(1,5) | D(1,6) | D(1,7) | D(1,8) | D(1,9) | D(1,10) | D(1,11) | D(1,12) |
|--------|--------|--------|--------|--------|--------|--------|--------|--------|---------|---------|---------|
| D(2,1) | D(2,2) | D(2,3) | D(2,4) | D(2,5) | D(2,6) | D(2,7) | D(2,8) | D(2,9) | D(2,10) | D(2,11) | D(2,12) |

4 MEM2

|  |  |  |  |
|--|--|--|--|
|  |  |  |  |
|  |  |  |  |
|  |  |  |  |

5 MEM3

|  |  |  |  |  |  |  |  |
|--|--|--|--|--|--|--|--|
|  |  |  |  |  |  |  |  |
|  |  |  |  |  |  |  |  |

APPENDIX 1-continued

6 Output
7
1 Step 2
2 MEM1

| D(3,1) | D(3,2) | D(3,3) | D(3,4) | D(3,5) | D(3,6) | D(3,7) | D(3,8) | D(3,9) | D(3,10) | D(3,11) | D(3,12) |
|--------|--------|--------|--------|--------|--------|--------|--------|--------|---------|---------|---------|
| D(4,1) | D(4,2) | D(4,3) | D(4,4) | D(4,5) | D(4,6) | D(4,7) | D(4,8) | D(4,9) | D(4,10) | D(4,11) | D(4,12) |

3 MEM2

| D(1,1) D(2,1) | D(1,2) D(2,2) | D(1,3) D(2,3) | D(1,4) D(2,4) | D(1,5) D(2,5) | D(1,6) D(2,6) | D(1,7) D(2,7) | D(1,8) D(2,8) | D(1,9) D(2,9) | D(1,10) D(2,10) | D(1,11) D(2,11) | D(1,12) D(2,12) |
|---|---|---|---|---|---|---|---|---|---|---|---|
|   |   |   |   |   |   |   |   |   |   |   |   |
|   |   |   |   |   |   |   |   |   |   |   |   |

4 MEM3

|   |   |   |   |   |   |   |   |
|---|---|---|---|---|---|---|---|
|   |   |   |   |   |   |   |   |
|   |   |   |   |   |   |   |   |
|   |   |   |   |   |   |   |   |

APPENDIX 1-continued

5 Output
6
1
2 Step 3
3 MEM1

| D(5,1) | D(5,2) | D(5,3) | D(5,4) | D(5,5) | D(5,6) | D(5,7) | D(5,8) | D(5,9) | D(5,10) | D(5,11) | D(5,12) |
|---|---|---|---|---|---|---|---|---|---|---|---|
| D(6,1) | D(6,2) | D(6,3) | D(6,4) | D(6,5) | D(6,6) | D(6,7) | D(6,8) | D(6,9) | D(6,10) | D(6,11) | D(6,12) |

4 MEM2

| D(1,1) | D(2,1) | D(1,2) | D(2,2) | D(1,3) | D(2,3) | D(1,4) | D(2,4) | D(1,5) | D(2,5) | D(1,6) | D(2,6) | D(1,7) | D(2,7) | D(1,8) | D(2,8) | D(1,9) | D(2,9) | D(1,10) | D(2,10) | D(1,11) | D(2,11) | D(1,12) | D(2,12) |
|---|---|---|---|---|---|---|---|---|---|---|---|---|---|---|---|---|---|---|---|---|---|---|---|
| D(3,1) | D(4,1) | D(3,2) | D(4,2) | D(3,3) | D(4,3) | D(3,4) | D(4,4) | D(3,5) | D(4,5) | D(3,6) | D(4,6) | D(3,7) | D(4,7) | D(3,8) | D(4,8) | D(3,9) | D(4,9) | D(3,10) | D(4,10) | D(3,11) | D(4,11) | D(3,12) | D(4,12) |

5 MEM3

| | | | | | | | |
|---|---|---|---|---|---|---|---|
| | | | | | | | |
| | | | | | | | |

6 Output
7
8
1 Step 5
2 MEM1

| D(9,1) | D(9,2) | D(9,3) | D(9,4) | D(9,5) | D(9,6) | D(9,7) | D(9,8) | D(9,9) | D(9,10) | D(9,11) | D(9,12) |
|---|---|---|---|---|---|---|---|---|---|---|---|
| D(10,1) | D(10,2) | D(10,3) | D(10,4) | D(10,5) | D(10,6) | D(10,7) | D(10,8) | D(10,9) | D(10,10) | D(10,11) | D(10,12) |

APPENDIX 1-continued

MEM2

| D(1,1) | D(2,1) | D(1,2) | D(2,2) | D(1,3) | D(2,3) | D(1,4) | D(2,4) | D(1,5) | D(2,5) | D(1,6) | D(2,6) | D(1,7) | D(2,7) | D(1,8) | D(2,8) | D(1,9) | D(2,9) | D(1,10) | D(2,10) | D(1,11) | D(2,11) | D(1,12) | D(2,12) |
|---|---|---|---|---|---|---|---|---|---|---|---|---|---|---|---|---|---|---|---|---|---|---|---|
| D(3,1) | D(4,1) | D(3,2) | D(4,2) | D(3,3) | D(4,3) | D(3,4) | D(4,4) | D(3,5) | D(4,5) | D(3,6) | D(4,6) | D(3,7) | D(4,7) | D(3,8) | D(4,8) | D(3,9) | D(4,9) | D(3,10) | D(4,10) | D(3,11) | D(4,11) | D(3,12) | D(4,12) |
| D(5,1) | D(6,1) | D(5,2) | D(6,2) | D(5,3) | D(6,3) | D(5,4) | D(6,4) | D(5,5) | D(6,5) | D(5,6) | D(6,6) | D(5,7) | D(6,7) | D(5,8) | D(6,8) | D(5,9) | D(6,9) | D(5,10) | D(6,10) | D(5,11) | D(6,11) | D(5,12) | D(6,12) |
| D(7,1) | D(8,1) | D(7,2) | D(8,2) | D(7,3) | D(8,3) | D(7,4) | D(8,4) | D(7,5) | D(8,5) | D(7,6) | D(8,6) | D(7,7) | D(8,7) | D(7,8) | D(8,8) | D(7,9) | D(8,9) | D(7,10) | D(8,10) | D(7,11) | D(8,11) | D(7,12) | D(8,12) |

MEM3

Output

Step 6

MEM1

MEM2

| D(1,1) | D(2,1) | D(1,2) | D(2,2) | D(1,3) | D(2,3) | D(1,4) | D(2,4) | D(1,5) | D(2,5) | D(1,6) | D(2,6) | D(1,7) | D(2,7) | D(1,8) | D(2,8) | D(1,9) | D(2,9) | D(1,10) | D(2,10) | D(1,11) | D(2,11) | D(1,12) | D(2,12) |
|---|---|---|---|---|---|---|---|---|---|---|---|---|---|---|---|---|---|---|---|---|---|---|---|
| D(3,1) | D(4,1) | D(3,2) | D(4,2) | D(3,3) | D(4,3) | D(3,4) | D(4,4) | D(3,5) | D(4,5) | D(3,6) | D(4,6) | D(3,7) | D(4,7) | D(3,8) | D(4,8) | D(3,9) | D(4,9) | D(3,10) | D(4,10) | D(3,11) | D(4,11) | D(3,12) | D(4,12) |
| D(5,1) | D(6,1) | D(5,2) | D(6,2) | D(5,3) | D(6,3) | D(5,4) | D(6,4) | D(5,5) | D(6,5) | D(5,6) | D(6,6) | D(5,7) | D(6,7) | D(5,8) | D(6,8) | D(5,9) | D(6,9) | D(5,10) | D(6,10) | D(5,11) | D(6,11) | D(5,12) | D(6,12) |
| D(7,1) | D(8,1) | D(7,2) | D(8,2) | D(7,3) | D(8,3) | D(7,4) | D(8,4) | D(7,5) | D(8,5) | D(7,6) | D(8,6) | D(7,7) | D(8,7) | D(7,8) | D(8,8) | D(7,9) | D(8,9) | D(7,10) | D(8,10) | D(7,11) | D(8,11) | D(7,12) | D(8,12) |
| D(9,1) | D(10,1) | D(9,2) | D(10,2) | D(9,3) | D(10,3) | D(9,4) | D(10,4) | D(9,5) | D(10,5) | D(9,6) | D(10,6) | D(9,7) | D(10,7) | D(9,8) | D(10,8) | D(9,9) | D(10,9) | D(9,10) | D(10,10) | D(9,11) | D(10,11) | D(9,12) | D(10,12) |

APPENDIX 1-continued

4 MEM3

5 Output
6
7
1 Step 7
2 MEM1

3 MEM2

| D(1,4) D(2,4) | D(1,5) D(2,5) | D(1,6) D(2,6) | D(1,7) D(2,7) | D(1,8) D(2,8) | D(1,9) D(2,9) | D(1,10) D(2,10) | D(1,11) D(2,11) | D(1,12) D(2,12) |
|---|---|---|---|---|---|---|---|---|
| D(3,4) D(4,4) | D(3,5) D(4,5) | D(3,6) D(4,6) | D(3,7) D(4,7) | D(3,8) D(4,8) | D(3,9) D(4,9) | D(3,10) D(4,10) | D(3,11) D(4,11) | D(3,12) D(4,12) |
| D(5,4) D(6,4) | D(5,5) D(6,5) | D(5,6) D(6,6) | D(5,7) D(6,7) | D(5,8) D(6,8) | D(5,9) D(6,9) | D(5,10) D(6,10) | D(5,11) D(6,11) | D(5,12) D(6,12) |
| D(7,4) D(8,4) | D(7,5) D(8,5) | D(7,6) D(8,6) | D(7,7) D(8,7) | D(7,8) D(8,8) | D(7,9) D(8,9) | D(7,10) D(8,10) | D(7,11) D(8,11) | D(7,12) D(8,12) |
| D(9,4) D(10,4) | D(9,5) D(10,5) | D(9,6) D(10,6) | D(9,7) D(10,7) | D(9,8) D(10,8) | D(9,9) D(10,9) | D(9,10) D(10,10) | D(9,11) D(10,11) | D(9,12) D(10,12) |

4 MEM3

| D(1,1) | D(1,2) | D(1,3) |
|---|---|---|
| D(2,1) | D(2,2) | D(2,3) |
| D(3,1) | D(3,2) | D(3,3) |
| D(4,1) | D(4,2) | D(4,3) |
| D(5,1) | D(5,2) | D(5,3) |
| D(6,1) | D(6,2) | D(6,3) |
| D(7,1) | D(7,2) | D(7,3) |
| D(8,1) | D(8,2) | D(8,3) |
| D(9,1) | D(9,2) | D(9,3) |
| D(10,1) | D(10,2) | D(10,3) |

APPENDIX 1-continued

Step 8

MEM1

(empty table)

MEM2

| D(1,7) | D(2,7) | D(1,8) | D(2,8) | D(1,9) | D(2,9) | D(1,10) | D(2,10) | D(1,11) | D(2,11) | D(1,12) | D(2,12) |
| D(3,7) | D(4,7) | D(3,8) | D(4,8) | D(3,9) | D(4,9) | D(3,10) | D(4,10) | D(3,11) | D(4,11) | D(3,12) | D(4,12) |
| D(5,7) | D(6,7) | D(5,8) | D(6,8) | D(5,9) | D(6,9) | D(5,10) | D(6,10) | D(5,11) | D(6,11) | D(5,12) | D(6,12) |
| D(7,7) | D(8,7) | D(7,8) | D(8,8) | D(7,9) | D(8,9) | D(7,10) | D(8,10) | D(7,11) | D(8,11) | D(7,12) | D(8,12) |
| D(9,7) | D(10,7) | D(9,8) | D(10,8) | D(9,9) | D(10,9) | D(9,10) | D(10,10) | D(9,11) | D(10,11) | D(9,12) | D(10,12) |

MEM3

| D(1,4) | D(1,5) | D(1,6) |
| D(2,4) | D(2,5) | D(2,6) |
| D(3,4) | D(3,5) | D(3,6) |
| D(4,4) | D(4,5) | D(4,6) |
| D(5,4) | D(5,5) | D(5,6) |
| D(6,4) | D(6,5) | D(6,6) |
| D(7,4) | D(7,5) | D(7,6) |
| D(8,4) | D(8,5) | D(8,6) |
| D(9,4) | D(9,5) | D(9,6) |
| D(10,4) | D(10,5) | D(10,6) |

Output

| D(1,1) | D(2,1) | D(3,1) | D(4,1) | D(5,1) | D(6,1) | D(7,1) | D(8,1) | D(9,1) | D(10,1) |
| D(1,2) | D(2,2) | D(3,2) | D(4,2) | D(5,2) | D(6,2) | D(7,2) | D(8,2) | D(9,2) | D(10,2) |
| D(1,3) | D(2,3) | D(3,3) | D(4,3) | D(5,3) | D(6,3) | D(7,3) | D(8,3) | D(9,3) | D(10,3) |

APPENDIX 1-continued

Step 10
MEM1

MEM2

| MEM3 | | | |
|---|---|---|---|
| D(1,10) | D(1,11) | D(1,12) | |
| D(2,10) | D(2,11) | D(2,12) | |
| D(3,10) | D(3,11) | D(3,12) | |
| D(4,10) | D(4,11) | D(4,12) | |
| D(5,10) | D(5,11) | D(5,12) | |
| D(6,10) | D(6,11) | D(6,12) | |
| D(7,10) | D(7,11) | D(7,12) | |
| D(8,10) | D(8,11) | D(8,12) | |
| D(9,10) | D(9,11) | D(9,12) | |
| D(10,10) | D(10,11) | D(10,12) | |

APPENDIX 1-continued

5 Output

| D(1,7) | D(2,7) | D(3,7) | D(4,7) | D(5,7) | D(6,7) | D(7,7) | D(8,7) | D(9,7) | D(10,7) |
| D(1,8) | D(2,8) | D(3,8) | D(4,8) | D(5,8) | D(6,8) | D(7,8) | D(8,8) | D(9,8) | D(10,8) |
| D(1,9) | D(2,9) | D(3,9) | D(4,9) | D(5,9) | D(6,9) | D(7,9) | D(8,9) | D(9,9) | D(10,9) |

6 Step 11
1
2 MEM1

3 MEM2

APPENDIX 1-continued

4 MEM3

5 Output

| D(1,10) | D(2,10) | D(3,10) | D(4,10) | D(5,10) | D(6,10) | D(7,10) | D(8,10) | D(9,10) | D(10,10) |
| D(1,11) | D(2,11) | D(3,11) | D(4,11) | D(5,11) | D(6,11) | D(7,11) | D(8,11) | D(9,11) | D(10,11) |
| D(1,12) | D(2,12) | D(3,12) | D(4,12) | D(5,12) | D(6,12) | D(7,12) | D(8,12) | D(9,12) | D(10,12) |

6

APPENDIX 2

Step 7

MEM1

| | | | | | | | | | | | |
|---|---|---|---|---|---|---|---|---|---|---|---|
| | | | | | | | | | | | |
| | | | | | | | | | | | |
| | | | | | | | | | | | |

MEM2

| | | | | D(1,4) | D(1,5) | D(1,6) | D(1,7) | D(1,8) | D(1,9) | D(1,10) | D(1,11) | D(1,12) |
|---|---|---|---|---|---|---|---|---|---|---|---|---|
| | | | | D(2,4) | D(2,5) | D(2,6) | D(2,7) | D(2,8) | D(2,9) | D(2,10) | D(2,11) | D(2,12) |
| | | | | D(3,4) | D(3,5) | D(3,6) | D(3,7) | D(3,8) | D(3,9) | D(3,10) | D(3,11) | D(3,12) |
| | | | | D(4,4) | D(4,5) | D(4,6) | D(4,7) | D(4,8) | D(4,9) | D(4,10) | D(4,11) | D(4,12) |
| | | | | D(5,4) | D(5,5) | D(5,6) | D(5,7) | D(5,8) | D(5,9) | D(5,10) | D(5,11) | D(5,12) |
| | | | | D(6,4) | D(6,5) | D(6,6) | D(6,7) | D(6,8) | D(6,9) | D(6,10) | D(6,11) | D(6,12) |
| | | | | D(7,4) | D(7,5) | D(7,6) | D(7,7) | D(7,8) | D(7,9) | D(7,10) | D(7,11) | D(7,12) |
| | | | | D(8,4) | D(8,5) | D(8,6) | D(8,7) | D(8,8) | D(8,9) | D(8,10) | D(8,11) | D(8,12) |
| | | | | D(9,4) | D(9,5) | D(9,6) | D(9,7) | D(9,8) | D(9,9) | D(9,10) | D(9,11) | D(9,12) |
| | | | | D(10,4) | D(10,5) | D(10,6) | D(10,7) | D(10,8) | D(10,9) | D(10,10) | D(10,11) | D(10,12) |

MEM3

| D(1,1) | D(2,1) | D(3,1) | D(4,1) | D(5,1) | D(6,1) | D(7,1) | D(8,1) | D(9,1) | D(10,1) |
|---|---|---|---|---|---|---|---|---|---|
| D(1,2) | D(2,2) | D(3,2) | D(4,2) | D(5,2) | D(6,2) | D(7,2) | D(8,2) | D(9,2) | D(10,2) |
| D(1,3) | D(2,3) | D(3,3) | D(4,3) | D(5,3) | D(6,3) | D(7,3) | D(8,3) | D(9,3) | D(10,3) |

Output

Step 8

MEM1

| | | | | | | | | | | | |
|---|---|---|---|---|---|---|---|---|---|---|---|
| | | | | | | | | | | | |
| | | | | | | | | | | | |
| | | | | | | | | | | | |

MEM2

| | | | | | | | D(1,7) | D(1,8) | D(1,9) | D(1,10) | D(1,11) | D(1,12) |
|---|---|---|---|---|---|---|---|---|---|---|---|---|
| | | | | | | | D(2,7) | D(2,8) | D(2,9) | D(2,10) | D(2,11) | D(2,12) |
| | | | | | | | D(3,7) | D(3,8) | D(3,9) | D(3,10) | D(3,11) | D(3,12) |
| | | | | | | | D(4,7) | D(4,8) | D(4,9) | D(4,10) | D(4,11) | D(4,12) |
| | | | | | | | D(5,7) | D(5,8) | D(5,9) | D(5,10) | D(5,11) | D(5,12) |
| | | | | | | | D(6,7) | D(6,8) | D(6,9) | D(6,10) | D(6,11) | D(6,12) |
| | | | | | | | D(7,7) | D(7,8) | D(7,9) | D(7,10) | D(7,11) | D(7,12) |
| | | | | | | | D(8,7) | D(8,8) | D(8,9) | D(8,10) | D(8,11) | D(8,12) |
| | | | | | | | D(9,7) | D(9,8) | D(9,9) | D(9,10) | D(9,11) | D(9,12) |
| | | | | | | | D(10,7) | D(10,8) | D(10,9) | D(10,10) | D(10,11) | D(10,12) |

MEM3

| D(1,4) | D(2,4) | D(3,4) | D(4,4) | D(5,4) | D(6,4) | D(7,4) | D(8,4) | D(9,4) | D(10,4) |
|---|---|---|---|---|---|---|---|---|---|
| D(1,5) | D(2,5) | D(3,5) | D(4,5) | D(5,5) | D(6,5) | D(7,5) | D(8,5) | D(9,5) | D(10,5) |
| D(1,6) | D(2,6) | D(3,6) | D(4,6) | D(5,6) | D(6,6) | D(7,6) | D(8,6) | D(9,6) | D(10,6) |

APPENDIX 2-continued

5 Output

| D(1,1) | D(2,1) | D(3,1) | D(4,1) | D(5,1) | D(6,1) | D(7,1) | D(8,1) | D(9,1) | D(10,1) |
| D(1,2) | D(2,2) | D(3,2) | D(4,2) | D(5,2) | D(6,2) | D(7,2) | D(8,2) | D(9,2) | D(10,2) |
| D(1,3) | D(2,3) | D(3,3) | D(4,3) | D(5,3) | D(6,3) | D(7,3) | D(8,3) | D(9,3) | D(10,3) |

6
7
1 Step 10
2 MEM1

3 MEM2

4 MEM3

| D(1,10) | D(2,10) | D(3,10) | D(4,10) | D(5,10) | D(6,10) | D(7,10) | D(8,10) | D(9,10) | D(10,10) |
| D(1,11) | D(2,11) | D(3,11) | D(4,11) | D(5,11) | D(6,11) | D(7,11) | D(8,11) | D(9,11) | D(10,11) |
| D(1,12) | D(2,12) | D(3,12) | D(4,12) | D(5,12) | D(6,12) | D(7,12) | D(8,12) | D(9,12) | D(10,12) |

APPENDIX 2-continued

5 Output

| D(1,7) | D(2,7) | D(3,7) | D(4,7) | D(5,7) | D(6,7) | D(7,7) | D(8,7) | D(9,7) | D(10,7) |
| D(1,8) | D(2,8) | D(3,8) | D(4,8) | D(5,8) | D(6,8) | D(7,8) | D(8,8) | D(9,8) | D(10,8) |
| D(1,9) | D(2,9) | D(3,9) | D(4,9) | D(5,9) | D(6,9) | D(7,9) | D(8,9) | D(9,9) | D(10,9) |

1 Step 11
2 MEM1

3 MEM2

4 MEM3

5 Output

| D(1,10) | D(2,10) | D(3,10) | D(4,10) | D(5,10) | D(6,10) | D(7,10) | D(8,10) | D(9,10) | D(10,10) |
| D(1,11) | D(2,11) | D(3,11) | D(4,11) | D(5,11) | D(6,11) | D(7,11) | D(8,11) | D(9,11) | D(10,11) |
| D(1,12) | D(2,12) | D(3,12) | D(4,12) | D(5,12) | D(6,12) | D(7,12) | D(8,12) | D(9,12) | D(10,12) |

The invention claimed is:

1. A method, comprising:
   subdividing an input data block into sub-blocks, each sub-block having a determined number of data rows and a determined number of data columns, the sub-blocks being distributed in the input data block in rows of sub-blocks and columns of sub-blocks transversal to the rows of sub-blocks;
   transferring the data contained in the input data block into a first memory, in an order in which the data appears in an input data stream;
   transferring the data contained in the input data block, by row of sub-blocks, from the first memory into a second memory, wherein the data of each sub-block of the input data block is accessible from an address of the sub-block;
   selectively transferring the data contained in each sub-block, by column of sub-blocks, from the second memory to a third memory, by putting the data of each sub-block back into data rows and columns in the sub-block; and
   transferring the data contained in the input data block by data column into an output stream, wherein the transferring the data contained in the input data block into the output stream includes:
      transferring data from the second memory to the output stream when the determined number of data columns in each sub-block is equal to 1; and
      transferring data from the third memory to the output stream when the number of data columns in each sub-block is greater than 1, wherein the subdividing and the transferring of data are performed by one or more configured processing devices.

2. The method according to claim 1, further comprising:
   selecting the determined number of rows and the determined number of columns of one sub-block, so that a number of rows and a number of columns of the input data block are respectively a multiple of the number of rows and of the number of columns of the sub-block.

3. The method according to claim 1 wherein the data of each sub-block in the second memory is accessed from a sub-block index number stored in a fourth memory.

4. The method according to claim 3 wherein the number of rows and the number of columns of each sub-block are chosen so as to limit the total size of the first, third and fourth memories.

5. The method according to claim 1 wherein the input data block is a first data block, further comprising:
   transferring data of a row of sub-blocks of a second data block into the second memory to addresses occupied by data of one column of sub-blocks of the first data block prior to the data of the one column of sub-blocks being transferred into the third memory or into the output stream.

6. The method according to claim 1 wherein transferring the data contained in each sub-block, by column of sub-blocks, from the second memory to the third memory includes transferring a first column of data from each sub-block of the column of sub-blocks before a second column of data from any sub-block of the column of sub-blocks is transferred.

7. The method according to claim 1 wherein transferring the data contained in each sub-block, by column of sub-blocks, from the second memory to the third memory includes transferring every column of data from a first sub-block of the column of sub-blocks before any column of data from a second sub-block of the column of sub-blocks is transferred.

8. The method according to claim 1 wherein transferring the data contained in the data block by data column into the output stream includes transferring a first column of data from each sub-block of the column of sub-blocks before a second column of data from each sub-block of the column of sub-blocks is transferred.

9. The method according to claim 1 wherein subdividing the input data block into sub-blocks includes dynamically subdividing into a different determined number of data rows or a different determined number of data columns for differing sizes of input data blocks.

10. The method of claim 1, further comprising determining the determined number of rows and the determined number of columns of the sub-blocks based on a size of the input data block.

11. The method of claim 10 wherein the input data block is a first input data block of a series of input data blocks.

12. A device, comprising:
    an input configured to receive data blocks; and
    one or more processing devices configured to:
       subdivide a received input data block into sub-blocks, each sub-block having a determined number of data rows and a determined number of data columns, the sub-blocks being distributed in the input data block in rows of sub-blocks and columns of sub-blocks transversal to the rows of sub-blocks;
       transfer the data contained in the input data block into a first memory, in an order in which the data appears in an input data stream;
       transfer the data contained in the input data block, by row of sub-blocks, from the first memory into a second memory, wherein the data of each sub-block of the input data block is accessible from an address of the sub-block;
       selectively transfer the data contained in each sub-block, by column of sub-blocks, from the second memory to a third memory, by putting the data of each sub-block back into data rows and columns in the sub-block; and
       transfer the data contained in the input data block by data column into an output stream, the transferring the data contained in the input data block into the output stream including:
          transferring data from the second memory to the output stream when the determined number of data columns in each sub-block is equal to 1; and
          transferring data from the third memory to the output stream when the number of data columns in each sub-block is greater than 1.

13. The device of claim 12 wherein the one or more processing devices are configured to:
    select the determined number of rows and the determined number of columns of one sub-block, so that a number of rows and a number of columns of the input data block are respectively a multiple of the number of rows and of the number of columns of the sub-block.

14. The device of claim 12, further comprising the first, second and third memories.

15. The device of claim 12 wherein transferring the data contained in each sub-block, by column of sub-blocks, from the second memory to the third memory includes transferring a first column of data from each sub-block of the column of sub-blocks before a second column of data from any sub-block of the column of sub-blocks is transferred.

16. The device of claim 12 wherein the one or more processing devices are configured to determine the determined number of rows and the determined number of columns of the sub-blocks based on a size of the input data block.

17. The device of claim 16 wherein the input data block is a first input data block of a series of input data blocks.

* * * * *